US00RE45259E

(19) United States
(12) Reissued Patent
Huang

(10) Patent Number: US RE45,259 E
(45) Date of Reissued Patent: Nov. 25, 2014

(54) HIT AHEAD HIERARCHICAL SCALABLE PRIORITY ENCODING LOGIC AND CIRCUITS

(76) Inventor: Xiaohua Huang, San Jose, CA (US)

(21) Appl. No.: 13/355,449

(22) Filed: Jan. 20, 2012

Related U.S. Patent Documents

Reissue of:

(64) Patent No.: 7,652,903
Issued: Jan. 26, 2010
Appl. No.: 11/073,116
Filed: Mar. 4, 2005

U.S. Applications:

(60) Provisional application No. 60/550,537, filed on Mar. 4, 2004.

(51) Int. Cl.
*G11C 15/00* (2006.01)

(52) U.S. Cl.
USPC ..... 365/49.1; 365/230.01; 365/230.05; 365/230.06

(58) Field of Classification Search
USPC ..... 365/49.1, 230.01, 230.05, 230.06
See application file for complete search history.

(56) References Cited

U.S. PATENT DOCUMENTS

| | | | | |
|---|---|---|---|---|
| 6,249,449 | B1 * | 6/2001 | Yoneda et al. | 365/49.18 |
| 6,307,767 | B1 * | 10/2001 | Fuh | 365/49.17 |
| 6,392,910 | B1 * | 5/2002 | Podaima et al. | 365/49 |
| 6,505,271 | B1 * | 1/2003 | Lien et al. | 711/108 |
| 7,043,601 | B2 * | 5/2006 | McKenzie et al. | 711/108 |
| 7,464,217 | B2 * | 12/2008 | Braceras et al. | 711/108 |

* cited by examiner

*Primary Examiner* — Han Yang

(57) ABSTRACT

In this invention a hit ahead multi-level hierarchical scalable priority encoding logic and circuits are disclosed. The advantage of hierarchical priority encoding is to improve the speed and simplify the circuit implementation and make circuit design flexible and scalable. To reduce the time of waiting for previous level priority encoding result, hit signal is generated first in each level to participate next level priority encoding, and it is called Hit Ahead Priority Encoding (HAPE) encoding. The hierarchical priority encoding can be applied to the scalable architecture among the different sub-blocks and can also be applied with in one sub-block. The priority encoding and hit are processed completely parallel without correlation, and the priority encoding, hit generation, address encoding and MUX selection of the address to next level all share same structure of circuits.

36 Claims, 8 Drawing Sheets

HIT AHEAD HIERARCHICAL SCALABLE PRIORITY ENCODING LOGIC AND CIRCUITS

Matter enclosed in heavy brackets [ ] appears in the original patent but forms no part of this reissue specification; matter printed in italics indicates the additions made by reissue.

This application claims the benefit of provisional U.S. Application Ser. No. 60/550,537, entitled "Priority encoding logic and Circuits," filed Mar. 4, 2004, which is incorporated herein by reference in its entirety for all purposes.

FIELD OF THE INVENTION

The presentation relates to content addressable memory. In particular, the present invention relates to logic and circuits of priority encoding of match or hit address.

BACKGROUND OF THE INVENTION

In ternary content addressable memory, not every bit in each row are compared in the searching or comparing process, so some time in one comparison, there are more than one row matching the input content, it is called multi-hit or match. In multi-hit case, one protocol was made to select the highest priority address. The logic of selecting the highest priority address is called priority encoding.

Assume we have $\{A_0, A_1, \ldots A_{n-1}\}$ hit signals from the corresponding addresses and define $A_0$ has the highest priority and $A_n$ has the lowest priority. Assume some of $\{A_0, A_1, \ldots A_{n-1}, A_n\}$ are logic "1" and all of the others are logic "0", the priority encoding keep the highest priority "1" as "1" and convert all the other "1" into "0". The logic operation of this transform:

$$\{A_0, A_1, \ldots A_{n-1}, A_n\} \Longrightarrow \{h_0, h_1, \ldots h_{n-1}, h_n\} \quad (1)$$

can logically be expressed as:

$$h_0 = A_0 \quad (2)$$

$$h_1 = \overline{A}_0 * A_1$$

$$h_2 = \overline{A}_0 * \overline{A}_1 * A_2$$

$$\ldots$$

$$h_n = \overline{A}_0 * \overline{A}_1 * \overline{A}_2 \ldots A_{n-1} * \overline{A}_n$$

Which means only when $A_0$ to $A_{i-1}$, are all zero, $h_i = A_i$, otherwise no matter $A_i = 0$ or 1, $h_i = 0$.

After the priority encoding, the hit address with the highest priority will be encoded to the binary address.

If the entry N are large, say 1K to 128K or even 1M, the calculation of priority logic (2) will take long time if we use serial logic. So we come out the inventions which will be described in the following.

SUMMERY OF THE INVENTION

In this invention, we propose a multi-level hierarchical scalable priority encoding. For example we make 8 entry as one group as first level and 8 first level as a second level, total 64 entry. Then we can make 8 second level as third level, total 512 entry, and so on. The advantage to make hierarchical priority encoding is to improve the speed, and simplify the circuit implementation and make circuit design flexible and scalable.

To reduce the time of waiting for previous level priority encoding result, we generate the hit signal first in each level to participate next level priority encoding, and we call it Hit Ahead Priority Encoding (HAPE) encoding.

The hierarchical priority encoding can be applied to the scalable architecture among the different sub-blocks and can also be applied with in one sub-block.

BRIEF DESCRIPTION OF THE DRAWINGS

Preferred embodiments of the invention will now be described, by way of example only, with reference to the attached Figures, wherein.

DETAILED DESCRIPTION OF THE INVENTIONS

Figure 1:
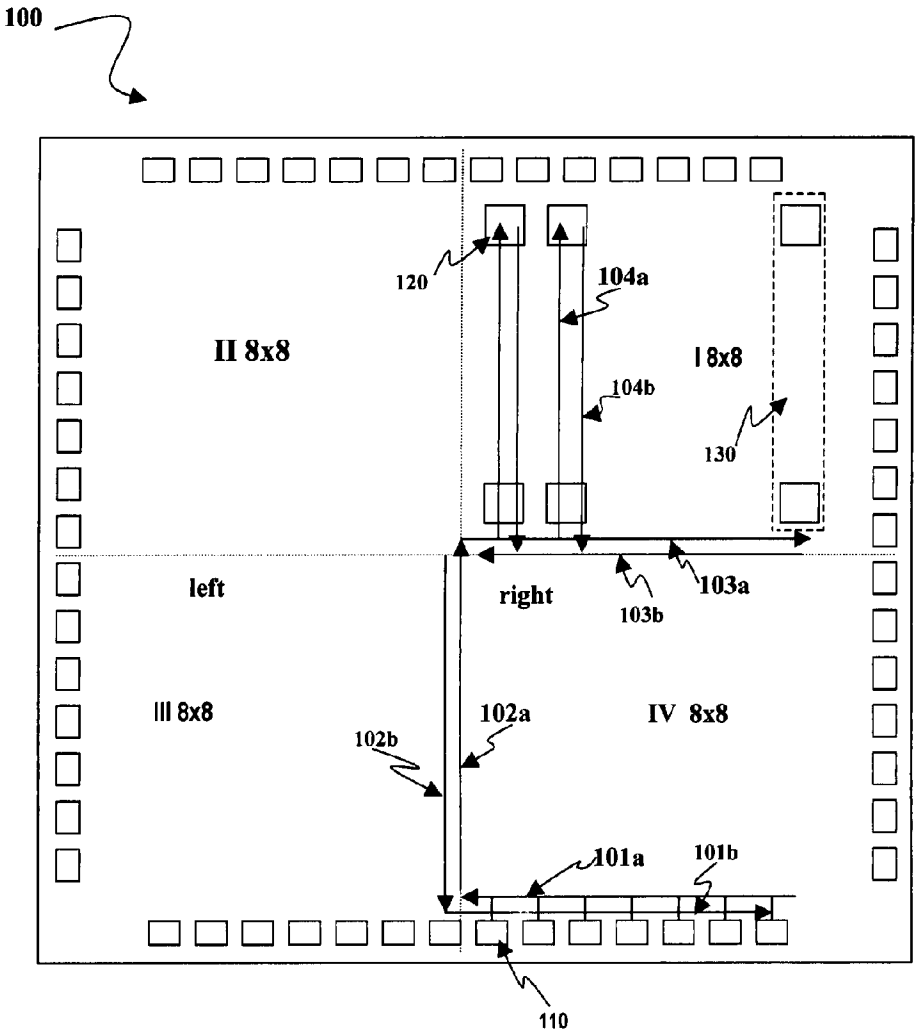
FIG. 1 is a block diagram of scalable architecture of CAM with many sub-block in accordance with one embodiment of the present invention.

To make the priority encoding logic calculation quicker, the entire CAM block can be divided into 256 block and divided into four quadruple, each quadruple has 8×8=64 block and each block has 8×8=64 entry as shown in FIG. 1 with embodiment 100.

This is just to explain the principle, the entry number of each sub-block and the number of sub-block can be different. Assume the data pad 110 are equally distributed in four side of the chip. If all of the data pad 110 are in one side or less than four side, the principle is same.

First step, route all the data signal in each side (only one side are drawn in the FIG. 1) to the middle point of that side, which is shown as route 101a in FIG. 1. Second step, route all the data signal to the center of the chip shown as route 102a in FIG. 1. Third step, in the center point send the data to be compared to both left and right side (only right side path 103a is shown in FIG. 1. Fourth step, send data to each one of the 8 column both upper part and down part shown as 104a in FIG. 1. Fifth step, the data to be compared are then sent to each sub-block 120 in each column to perform the comparison with each entry in every sub-block 120. In embedded application, the entry number of TCAM is not very large. In that case, the data path start from path 104a. If only some selected sub-block are searched or compared, the data to be compared will only be sent into those sub-block to save power consumption. After comparison with each entry inside each sub-block 120, the first level and second level priority encoding and binary encoding are performed which will be explained in details in FIG. 2, then the priority encoding in each column 130 among 8 sub-block will be performed as third level priority encoding and the hit address are sent out through path 104b. Next step fourth level priority encoding will be performed among 8 column 130 in each quadruple and the Hit address are sent out through path 103b. Next step the priority encoding will be performed in the center of chip among four quadruple and the hit address will be sent through path 102b. Last step the hit address are sent to the output pad 110 through path 101b. The priority encoding among upper quadruple and lower part quadruple can be performed together in path 103b.

Figure 2A:
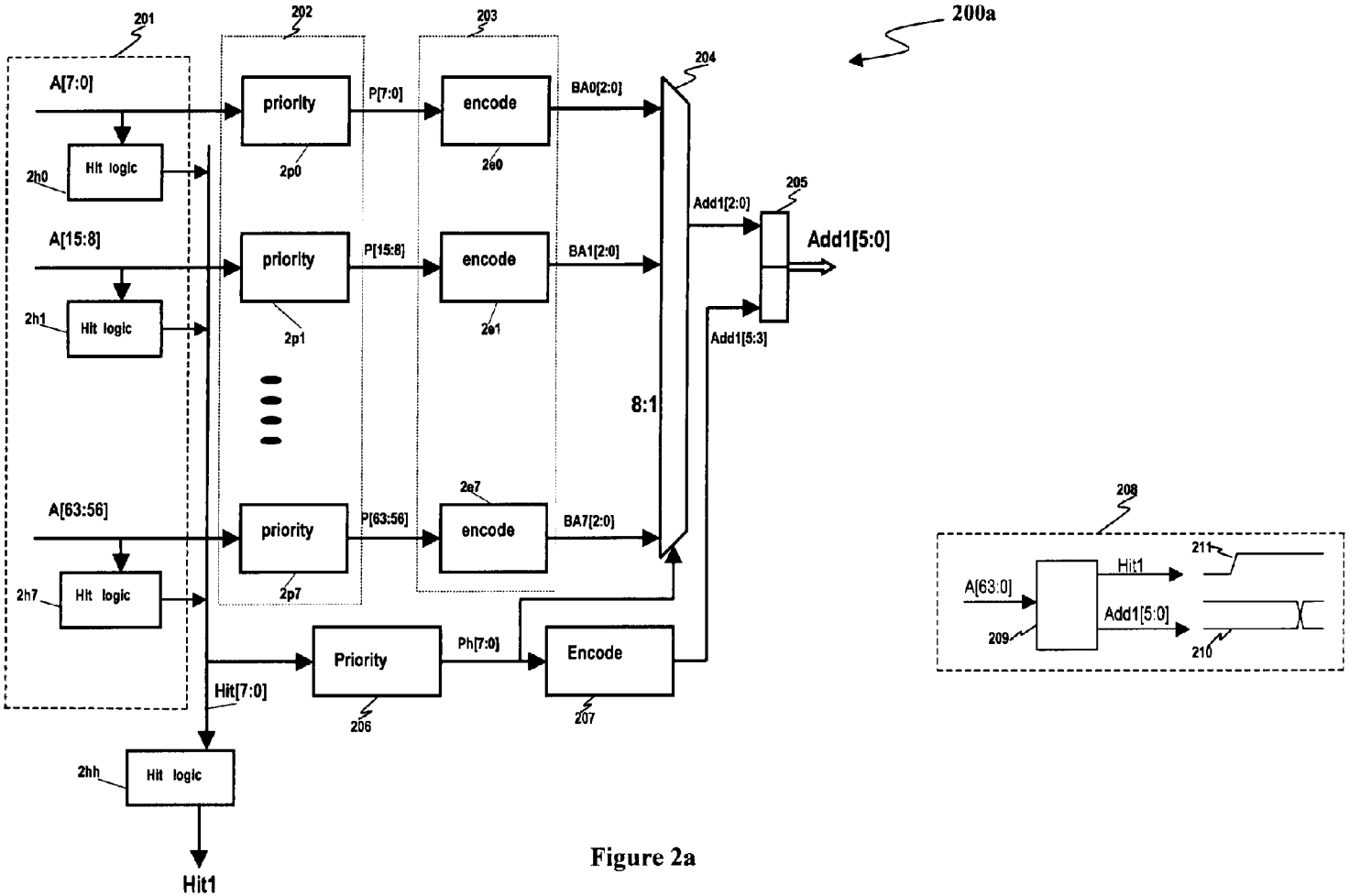
FIG. 2a is a logic block diagram of hierarchical priority encoding and match address binary encoding within one sub-block in accordance with one embodiment of present invention.

The priority encoding logic calculation block diagram for each 8×8=64 entry sub-block 120 are shown in FIG. 2a with embodiment 200a. Each 8 entry of 64 entry are grouped together to do hit logic function from 2h0 to 2h7 and generate Hit[0] to Hit[7] in block 201. In the same time each 8 entry of 64 entry are performed priority encoding logic calculation in each block from 2p0 to 2p7 of embodiment block 202 to generate P[63:0], then proceed binary encoding from 2e0 to 2e7 in embodiment block 203 to generate any three bit BA0 [2:0] to BA7[2:0] binary address if there is a hit in any 8 bit group. The eight signal of Hit[0] to Hit[7] from block 201 will perform priority encoding in block 206 which is logically exact same as the priority encoding in each 8 entry group from 2p0 to 2p7. The Priority Hit Ph[7:0] from Hit[0] to Hit[7] will select the 8 to 1 mux 204 and select one three bit binary address from BA0[2:0] to BA7[2:0] and become Add1[2:0]. The priority bit of Hit[0] to Hit[7] is binary encoded in block 207 which is logically same as the binary encoding block from 2e0 to 2e7 to generate the address: Add1[5:3]. Add1[5:3] and Add1[2:0] make Add1[5:0]. Hit[0] to Hit[7] further perform the logic function in block 2hh which is logically same as any block 2h0 to 2h7 and generate the next level Hit1. Both Add1[5:0] and Hit1 will be passed to the next level.

Figure 2B:
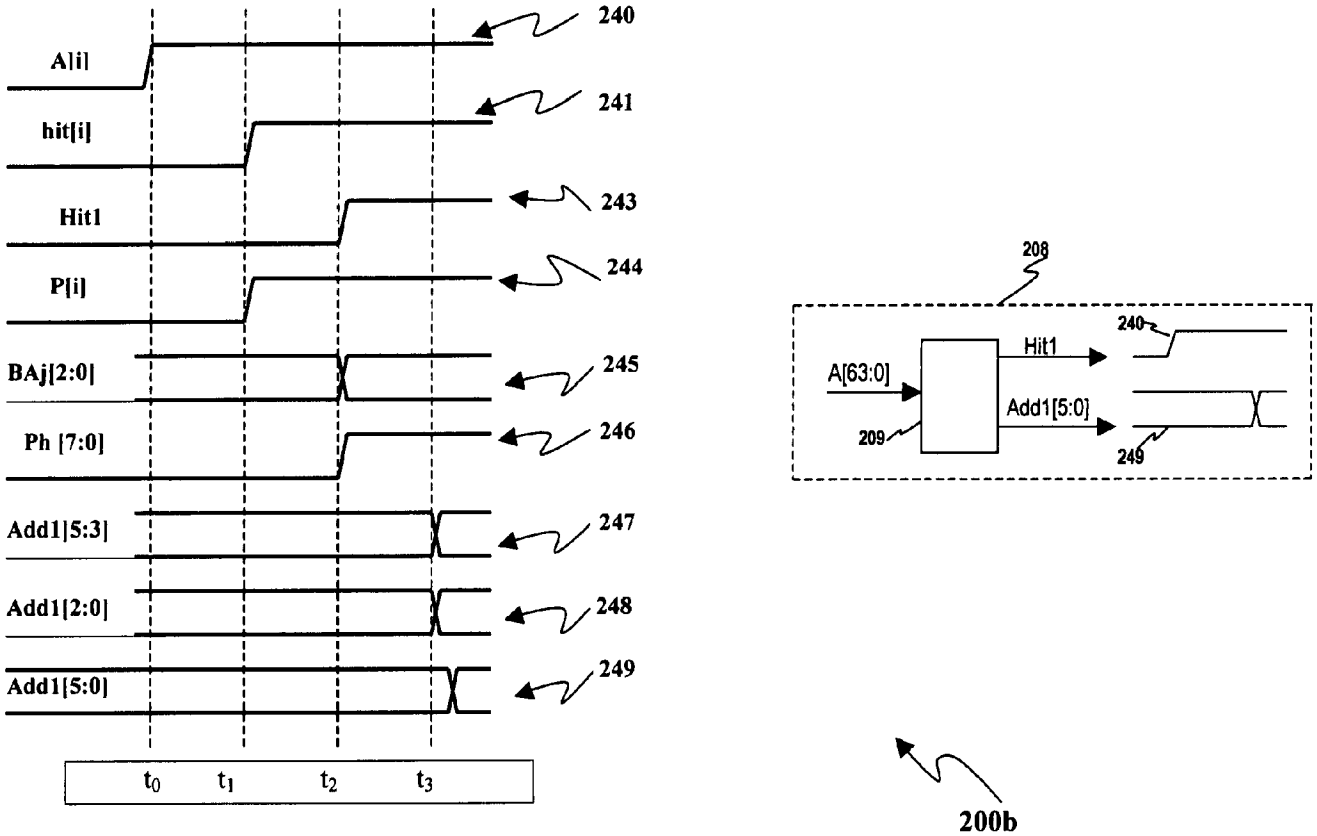
FIG. 2b is the and timing diagram in accordance with FIG. 2b of present invention.

The timing diagram of embodiment 200a is shown in FIG. 2b with embodiment 200b. Assume all the Hit or miss signal from TCAM comparison A[i] (A[63:0])which is drawn as signal 240 are available in time $t_0$, the first level hit signal Hit[7:0] generated by block 2h0 to 2h7 are drawn as 241 which is available at time $t_1$. In the same time A[63:0] are divided into eight group and priority encoded by block 2p0 to 2p7, generating P[0] to P[63] which are drawn as 244 and available at time $t_1$. The time delay of generating Ph[7:0] which are drawn as 246 and the time delay of generating.

BA0[2:0] to BA7[2:0] which are drawn as 245 are roughly same and they are generated in time $t_2$. So the Binary address Add1[2:0] which are drawn as 248 are selected by Ph[7:0] from the 8 group address BA0[2:0] to BA7[2:0] through an eight to one MUX 204 without any further delay except the delay of MUX itself which is ($t_3$−$t_2$), and the address Add1 [5:3] which are drawn as 247, Add1[2:0] and Add[5:0] which are drawn as 249 are available at time $t_3$.

So the total delay from A[63:0] available to the output of binary hit address Add1[5:0] is about three stage delay(priority 2p0, binary encoding 2e0 and 8 to 1 MUX 204), where we call each block(2p0, 2e0 and 204 etc) as one stage. The delay of Hit1 243 is two stage delay. So the output of Hit1 which is available at $t_2$ which is one stage earlier than the output of binary Hit address Add1[5:0] 249 which is available at $t_3$. Only Hit1 and Add1[5:0] are sent to the next level priority encoding. The entire sub-block are abstracted as symbol 208. The timing delay of hit, priority encoding, binary encoding and 8 to 1 mux will be analyzed in details.

Figure 3:
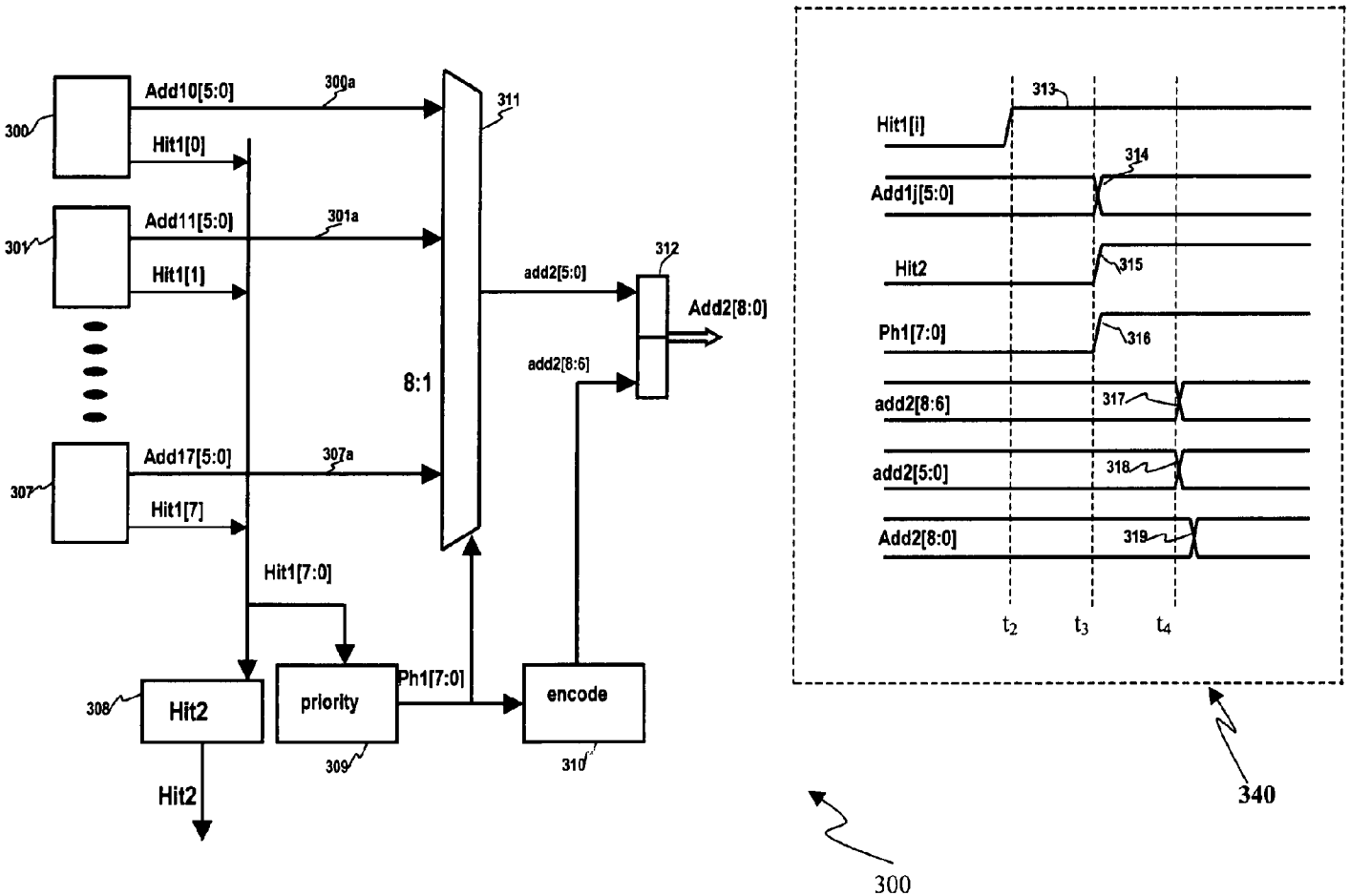
FIG. 3 is a logic block diagram of hierarchical priority encoding and match address binary encoding in higher level or among the different sub-block and timing diagram in accordance with one embodiment of present invention.

FIG. 3 is the logic block diagram of priority encoding of higher level among the eight group of 64 entry sub-block or among the 8 sub-block in every column 130 in FIG. 1. The Hit signal Hit1[7:0] which is marked as 313 in FIG. 3 are one stage earlier than the binary hit address Add10[5:0] to Add17 [5:0] which are marked as 314. Eight bit HIT signal of Hit1 [7:0] perform priority encoding in block 309, then the priority hit signal Ph1[7:0] will select Add2[5:0] from the eight input MUX 311.

In the same time Ph1[7:0] are encoded into binary address Add2[8:6] in block 310. Add2[8:6] and Add2[5:0] make Add2[8:0]. In block 308 eight input Hit1[7:0] generate Hit2 at time $t_3$ which is one stage earlier than Binary hit address Add2[8:0]. From the timing diagram 340 in FIG. 3, the delay of binary hit address Add1i[5:0] which is signal 314 to Add2 [8:0] which is marked as 319 is an 8 to 1 MUX delay which is ($t_4$−$t_3$), where i=0 to 7. In this hierarchical priority design, the delay on each level is an 8 to 1 MUX delay because the selection signal from the priority encoding among the hit signals is available one stage earlier and there is no extra delay to wait for the selection signal.

Another advantage of this hierarchical priority encoding is that the simplicity of circuit design. We already see that each level shares the same logic and circuit design. Say, the priority function block 206, 309 in each level are same in logic and circuit, which is shown in FIG. 4, embodiment 400.

Figure 4:
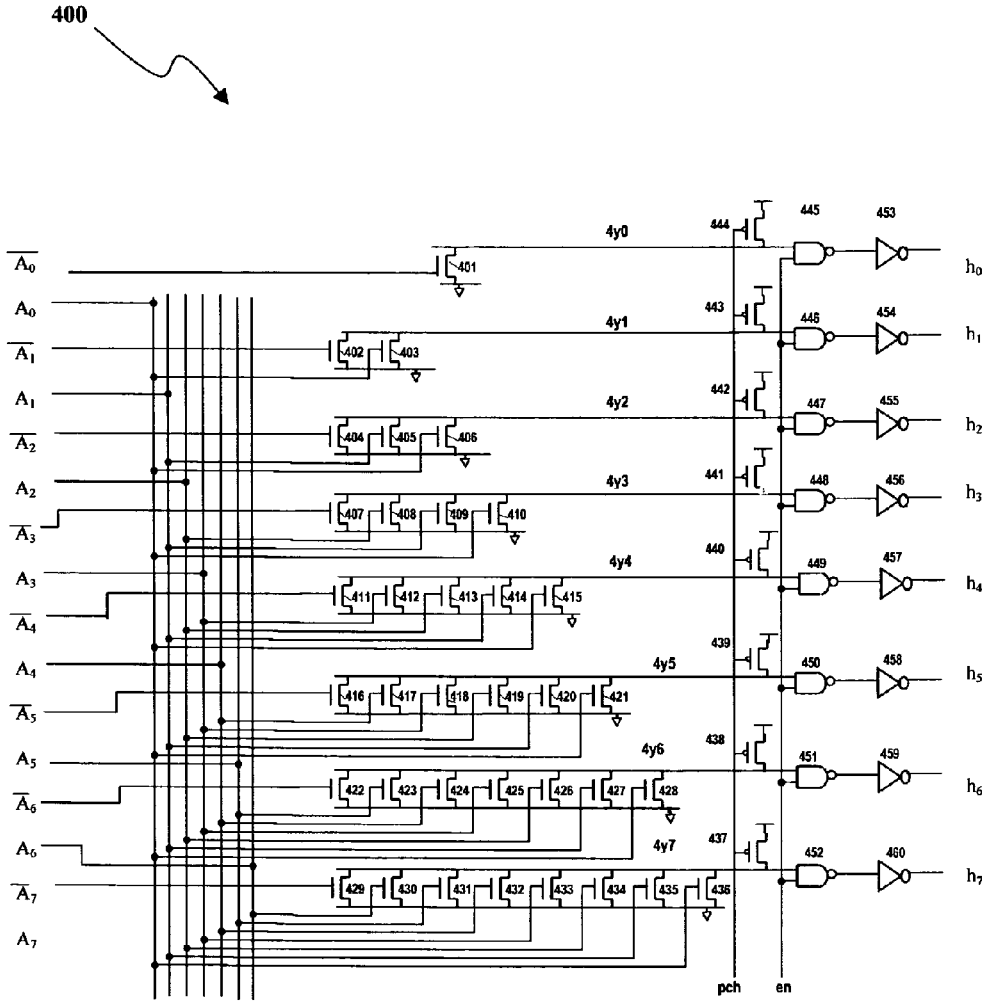
FIG. 4 is the circuit implementation of priority encoding with 8 input address in accordance with one embodiment of present invention.

Embodiment 400 in FIG. 4 is a sample implementation of the priority logic equation (2) which can be deduced to equation (3), where n=7.

$$h_0 = A_0 \tag{3}$$

$$h_1 = \overline{A_0} * A_1 = \overline{A_0 + \overline{A_1}}$$

$$h_2 = \overline{A_0} * \overline{A_1} * A_2 = \overline{A_0 + A_1 + \overline{A_2}}$$

$$\ldots$$

$$h_n = \overline{A_0} * \overline{A_1} * \overline{A_2} \ldots \overline{A_{n-1}} * A_n = \overline{A_0 + A_1 \ldots + A_{n-1} + \overline{A_n}}$$

The equation (3) is implemented as embodiment 400 in FIG. 4. Each line from 4y0 to 4y7 connect the drains of a few N transistors and each line 4y0 to 4y7 is the output of dynamic NOR logic of N transistor connected to that line. At the beginning of each cycle, the gate input signals $\overline{A_0}$ to $\overline{A_7}$ and $A_0$ to $A_7$ of all the N transistor from 401 to 436 are set to logic zero which turn off all the N transistors and the enable signal en is set to logic zero which makes all the output of NAND gate 445 to 452 to logic one and then turn all the output of inverter 453 to 460 into logic zero. The input pch of the P transistors 437 to 444 are set to logic zero and the P transistor 437 to 444 are turned on, which make the line 4y0 to 4y7 connecting to Vdd with low impedance and pre-charge the potential level of line 4y0 to 4y7 up to Vdd, then the signal pch is turned into Vdd and turn off the P transistors 437 to 444 before the TCAM comparison results $A_0$ to $A_7$ and their complementary $\overline{A_0}$ and $\overline{A_7}$ arrive. The Hit signal among A0 to A7 will be logical "one" at potential Vdd and the missed signal among A0 to A7 will be logical zero at potential ground. Only the highest priority hit, the output of the NOR gates are logically high. For example, $A_0$=0, $A_1$=0, $A_2$=Vdd and $A_3$=Vdd, the highest priority hit is $A_2$. The input of N transistor 401 is Vdd and N transistor 401 is turned on and the node 4y0 is discharged to ground. The input of transistor 402 which is the complementary of $A_1$ is also Vdd and the transistor 402 is ON, the node of 4y1 is also discharged to ground.

Since $A_0$=0, $A_1$=0, $A_2$=Vdd, $\overline{A}_2$=0, so the inputs of transistors 404, 405, 406 are all zero and the transistor 404, 405, 406 are all OFF and the node 4y2 will not be discharged and will be kept logically "one" at potential Vdd. Since $A_2$=Vdd, the inputs of transistors 408, 413, 419, 426 and 434 will be Vdd and all the node 4y3, 4y4, 4y5, 4y6 and 4y7 will be pulled to ground no matter if $A_3$, $A_4$, $A_5$, $A_6$ and $A_7$ are logically one or zero. The slowest path or worst case is only one input among eight N transistor 429, 430, 431, 432, 433, 434, 435 and 436 connected to node 4y7 is Vdd and all the others are zero, in that case one transistor need to discharge the drain parasitic capacitance of eight transistor and the metal wire capacitance connected to node 4y7. The signal en is characterized to turned to Vdd later then node 4y7 is discharged in worst case. The worst case delay of eight input priority encoding is that one N transistor discharging the drain parasitic capacitance of eight same size N transistor down to ground plus the delay of one NAND gate and one inverter.

Figure 5:
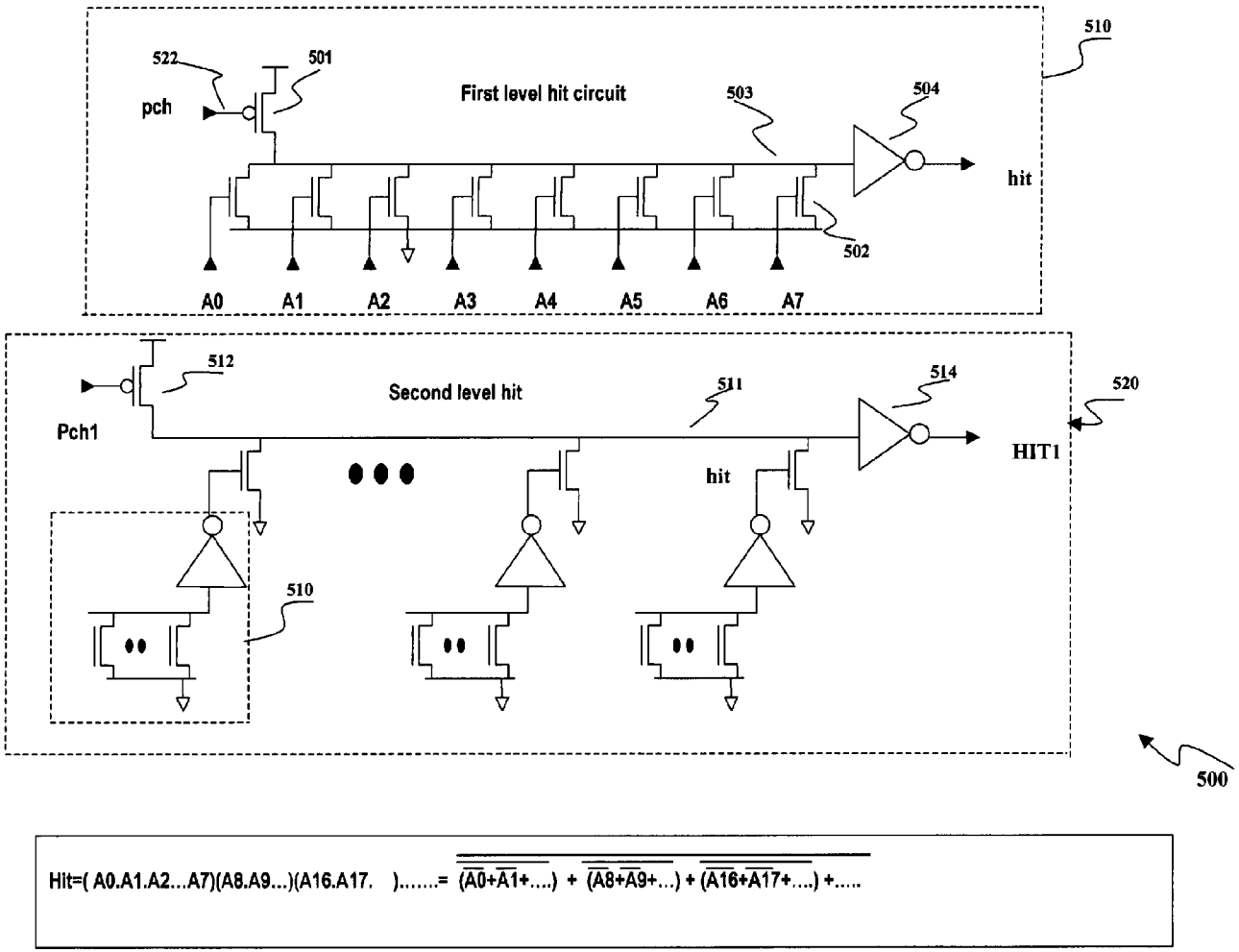
FIG. 5 is the circuit implementation of the HIT generation logic address in accordance with one embodiment of present invention.

The logic of Hit function block 2h0, 2h1, . . . 2hh and 308 in each level is also same and its logic and circuit are shown in FIG. 5. The embodiment 510 is the circuit implementation of one block 2h0 and the embodiment 520 is the circuit implementation of both block 201 and block 2hh in FIG. 2a together. The operation principle of 510 is: 1) all the input A0 to A7 are set to zero as in embodiment 400 in FIG. 4. 2) Set the gate input 522 of P transistor 501 to zero to pre-charge the node 503 to Vdd, then turn 522 to Vdd and turn off the P transistor 501 before the signal A0 to A7 arrive. If all the input A0 to A7 are zero, the input of N transistors are zero and all the N transistors 502 are OFF and the node 503 is kept in Vdd and the output signal of inverter 504 is zero. If only one input among A0 to A7 is Vdd and all the others are zero, which is the worst case, the delay of 510 is that one N transistor discharge the drain parasitic capacitance of the eight same size N transistor down to ground plus the delay of one inverter.

Figure 6:
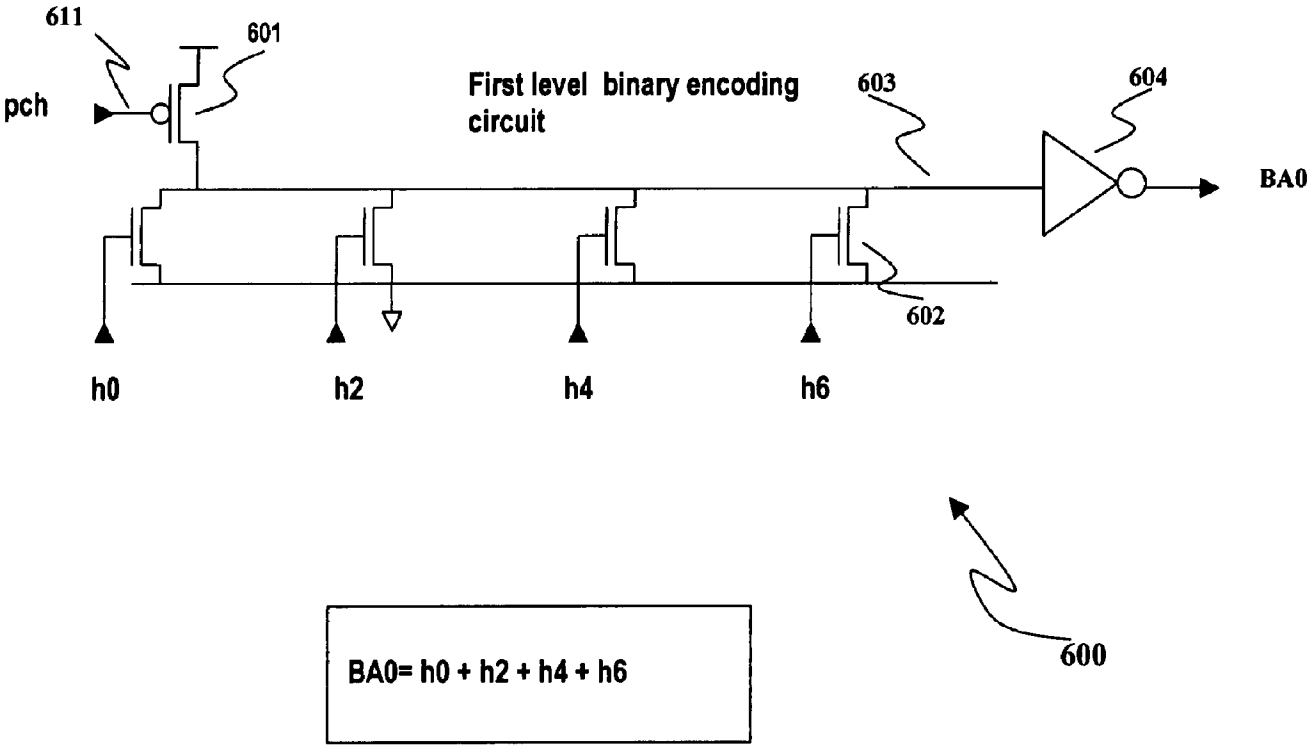
FIG. 6 is the circuit implementation of binary encoding logic in accordance with one embodiment of present invention.

The binary encoding logic and circuit is shown as embodiment 600 in FIG. 6. The operation principle of 600 is: 1) all the input $h_0$, $h_2$, $h_4$ and $h_6$ are set zero. 2) Set the gate input 611 of P transistor 601 to zero to pre-charge the node 603 to Vdd, then turn 611 to Vdd and turn off the P transistor 601 before the signal $h_0$, $h_2$, $h_4$ and $h_6$ arrive. If all the input signal $h_0$, $h_2$, $h_4$ and $h_6$ are zero, the input of N transistors are zero and all the N transistors 602 are OFF and the node 603 is kept in Vdd and the output signal of inverter 604 is zero. If only one input among $h_0$, $h_2$, $h_4$ and $h_6$ is Vdd and all the others are zero, which is the worst case, the delay of 600 is that one N transistor discharging the drain parasitic capacitance of the four same size N transistor down to ground plus the delay of one inverter.

Figure 7:
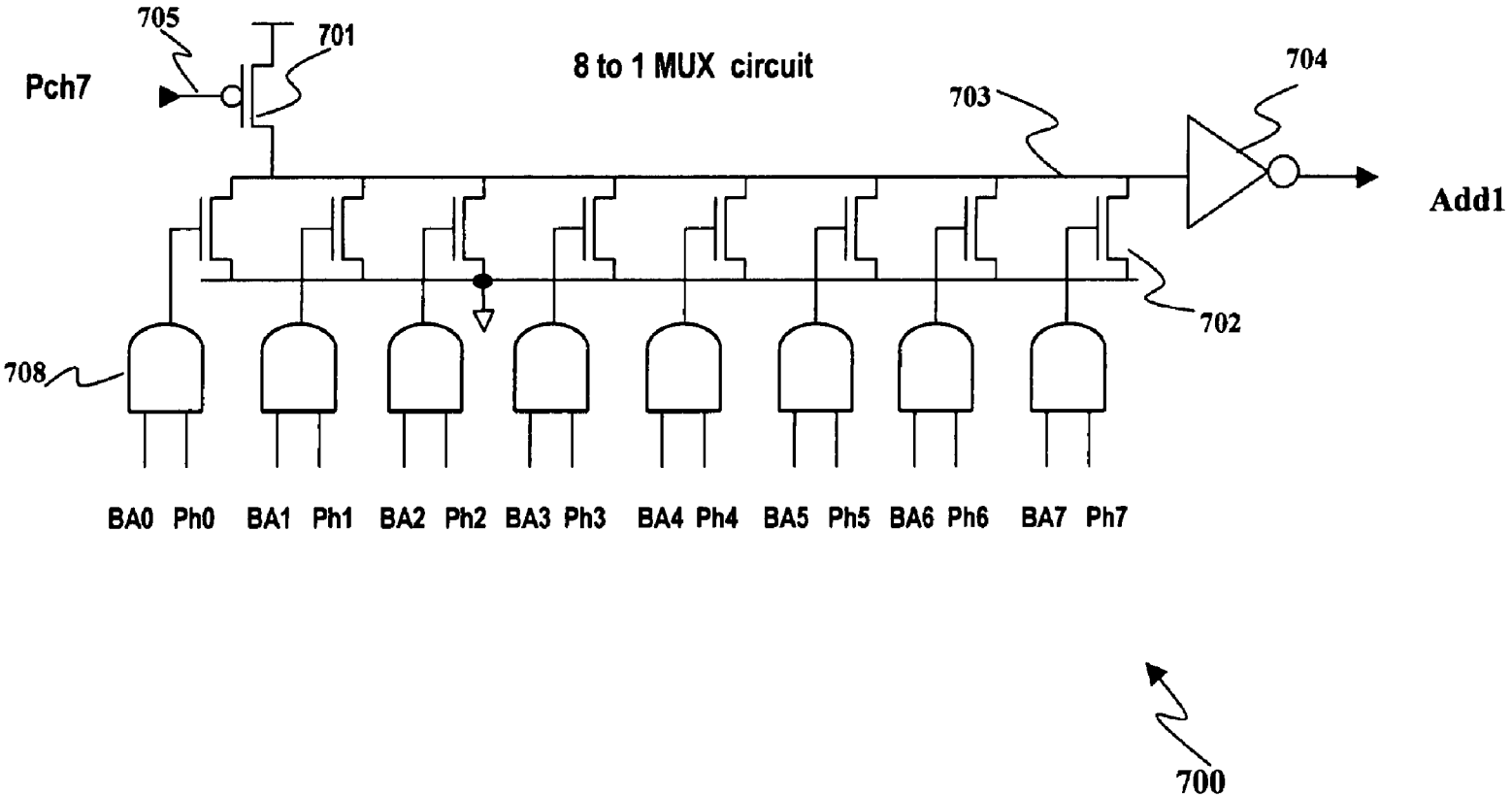
FIG. 7 is the circuit implementation of 8 to 1 mux in accordance with one embodiment of present invention.

The MUX logic and circuit is shown in FIG. 7 as embodiment 700. The operation principle of 700 is: 1) the input signal $Ph_0$, $Ph_1$, $Ph_2$, $Ph_3$, $Ph_4$, $Ph_5$, $Ph_6$ and $Ph_7$ are set zero. 2) Set the gate input 705 of P transistor 701 to zero to pre-charge the node 703 to Vdd, then turn 705 to Vdd and turn off the P transistor 701 before the signal $Ph_0$, $Ph_1$, $Ph_2$, $Ph_3$, $Ph_4$, $Ph_5$, $Ph_6$ and $P_7$ arrive. Since $Ph_0$, $Ph_1$, $Ph_2$, $Ph_3$, $Ph_4$, $Ph_5$, $Ph_6$ and $Ph_7$ are from Priority encoding, only one signal among them is Vdd and all the other are zero if there is hit. After AND logic, only one output of the seven AND gate 708 is equal to the input value which is the selected bit from $Ba_0$ to $Ba_7$. If the selected bit from $Ba_0$ to $Ba_7$ is zero, the node 703 is kept Vdd and the output of inverter 704 is zero and the selected bit value zero is passed out. If the selected bit from $Ba_0$ to $Ba_7$ is Vdd, one N transistor among eight N transistor 702 is turned ON and the node 703 is discharged down to ground and the output of inverter 704 is Vdd(logical one) and the selected bit value Vdd is passed out, which is the worst case, the delay of 700 is one N transistor discharging the drain parasitic capacitance of the eight same size N transistor down to ground plus the delay of one inverter and one AND gate. Usually one AND gate includes one inverter and one NAND gate, so the delay of 700 is one N transistor discharging the drain parasitic capacitance of the eight same size N transistor down to the ground plus the delay of two inverter and one NAND gate.

The entire Priority encoding logic and circuit are simplified as a four basic building block of 400, 510, 600 and 700 in FIGS. 4, 5, 6 and 7. The delay of each block 400, 510, 600 and 700 are comparable and we call the time of delay of each block 400, 510, 600 and 700 one stage. If we define the delay of hit logic block 510 as $T_h$, one inverter delay is $T_i$ and one NAND gate delay is $T_n$. The delay of priority encoding block 400 is $(T_h+T_n)$ since the delay of block 400 is one more NAND gate delay comparing with block 510. The delay of block 600 is roughly $T_h$. The delay of MUX block 700 is $(T_h+T_n+T_i)$. The extra delay of each higher level priority encoding is a MUX 700 selection delay because that the Hit signal in each priority encoding level is generated one stage earlier than the binary hit address and the selection signal of the MUX is already available when the binary address to be selected arrive and will not suffer extra delay.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A content address able memory(CAM) and hit ahead priority encoding(HAPE) logic, comprising:

a group of blocks which is arranged in column and row, each block has equal number of CAM match signals which are the input signals of priority encoding logic, each block has same priority encoding logic of CAM match signals within the block, the CAM match signals or input signals are arranged from lower priority to higher priority or from higher priority to lower priority, each CAM match signals or input signal has either high logic level "one" which is called hit or low logic level "zero" which is called miss, each block generates block hit when there is at least one CAM match signal is high logic "one" within the block or block miss signal when all the CAM match signals are in low logic level "zero" within the block and block binary address signal corresponding to the CAM match signals of highest priority within the block, a priority encoding logic of block hit or miss signals of each column, each column generates a column hit signal when there is at least one block hit signal within the column or column miss signal when there is only block miss signals within the column and column binary address corresponding to the CAM match signals of highest priority within the column, a priority encoding logic of column hit or miss signals of a group column, a group of column generates a hit signal when there is at least one column hit signal within the group column or a miss signal when there is only column miss signals within the group column and a group column binary address corresponding to the CAM match signals of highest priority within the group column.

2. A content address able memory(CAM) and hit ahead priority encoding(HAPE) logic of claim 1, further comprising:

a block multiplexer to select the binary address from the block of highest priority hit within the column as less significant portion of the column binary address; and a priority encoding logic of block hit signals to generate the block multiplexer control signal which select the block of highest priority hit within the column, and a binary address encoding logic of block hit signals to generate the more significant portion of the column highest priority binary address.

3. A content address able memory(CAM) and hit ahead priority encoding(HAPE) logic of claim 1, wherein each block comprises:

a group of sub-blocks, each sub-block has equal number of input signals, each sub-block has priority encoding and binary address encoding logic to generate sub-block highest priority binary address as well as hit or miss generating logic to generate sub-block hit or miss signal, and the sub-block hit or miss signal is generated independently before sub-block binary address;

a block hit or miss generating logic to generate block hit or miss signal and block hit or miss signal is generated independently before the block binary address is generated;

a sub-block multiplexer to select the binary address from the highest priority sub-block within the block as less significant portion of block binary address; and a priority encoding logic of each sub-block hit signals to generate the control signal of sub-block multiplexer, and a binary address encoding logic of each sub-block hit signals to generate the more significant portion of block binary address.

4. A content addressable memory(CAM) and hit ahead priority encoding(HAPE) logic of claim 3, wherein priority encoding logic, address encoding logic and multiplexer have the logic circuit of same structure.

5. A content address able memory(CAM) and hit ahead priority encoding(HAPE) logic of claim 4, wherein the hit generating logic, priority encoding logic, address encoding logic and multiplexer have dynamic NOR logic.

6. A content address able memory(CAM) and hit ahead priority encoding(HAPE) logic of claim 2, wherein the signal of controlling the multiplexer is generated before or in the same time that the less significant portion of the highest priority local address is generated.

*7. A content addressable memory (CAM) and hit ahead priority encoding (HAPE) logic, comprising:*

*a group of blocks which are arranged in columns and rows, each block having an equal number of CAM match signals which are the input signals of priority encoding logic, each block having a same priority encoding logic of CAM match signals within the block, the CAM match signals or input signals arranged from lower priority to higher priority or from higher priority to lower priority, each CAM match signal or input signal being either a high logic level "one which is called hit or a low logic level "zero" which is called miss, each block configured to generate a block hit signal when there is at least one CAM match signal that is a high logic level "one" within the block or a block miss signal when all the CAM match signals are a low logic level "zero" within the block and a block binary address signal corresponding to the CAM match signals of highest priority within the block;*

*a priority encoding logic of block hit or miss signals of each column, each column configured to generate a column hit signal when there is at least one block hit signal within the column or a column miss signal when there are only block miss signals within the column and a column binary address corresponding to the CAM match signals of highest priority within the column; and*

*a priority encoding logic of column hit or miss signals of a group column, the group column configured to generate a hit signal when there is at least one column hit signal within the group column or a miss signal when there are only column miss signals within the group column and a group column binary address corresponding to the CAM match signals of highest priority within the group column.*

*8. The content addressable memory (CAM) and hit ahead priority encoding (HAPE) logic of claim 7, further comprising:*

*a block multiplexer configured to select a binary address from the block having the highest priority hit within the column as a less significant portion of the column binary address,*

*the priority encoding logic of block hit signals being configured to generate a block multiplexer control signal for selecting the block having the highest priority hit within the column; and*

*a binary address encoding logic of block hit signals configured to generate a more significant portion of the column binary address.*

*9. The content addressable memory (CAM) and hit ahead priority encoding (HAPE) logic of claim 7, wherein each block comprises:*

*a group of sub-blocks, each sub-block having an equal number of input signals, each sub-block having priority encoding and binary address encoding logic configured to generate a sub-block highest priority binary address as well as hit or miss generating logic configured to generate a sub-block hit or miss signal, the sub-block hit or miss signal being generated independently before the sub-block binary address;*

*a block hit or miss generating logic configured to generate a block hit or miss signal, the block hit or miss signal being generated independently before the block binary address is generated;*

*a sub-block multiplexer configured to select a binary address from a highest priority sub-block within the block as a less significant portion of the block binary address; and*

*a priority encoding logic of each sub-block hit signals configured to generate a control signal of the sub-block multiplexer; and*

*a binary address encoding logic of the sub-block hit signals configured to generate a more significant portion of the block binary address.*

*10. The content addressable memory (CAM) and hit ahead priority encoding (HAPE) logic of claim 9, wherein the priority encoding logic, the address encoding logic, and the multiplexer have logic circuitry of the same structure.*

*11. The content addressable memory (CAM) and hit ahead priority encoding (HAPE) logic of claim 10, wherein the hit generating logic, the priority encoding logic, the address encoding logic, and the multiplexer have dynamic NOR logic.*

*12. The content addressable memory (CAM) and hit ahead priority encoding (HAPE) logic of claim 8, wherein a signal for controlling the multiplexer is generated before or at the*

*same time that the less significant portion of the highest priority local address is generated.*

*13. A content addressable memory (CAM) system, comprising:*

*one or more columns comprising a plurality of circuit segments, at least one of the circuit segments configured to generate a first circuit segment output based on whether at least one of a plurality of circuit segment inputs received by the at least one of the circuit segments corresponds to a first logic level,*

*at least one of the one or more columns configured to generate first address information based on a selected one of the first circuit segment outputs that corresponds to a second logic level, to set a node to a third logic level in response to a first input signal, and to subsequently change the node to a fourth logic level in response to one or more of a plurality of second input signals.*

*14. The CAM system of claim 13, wherein the first circuit segment output represents circuit segment hit information.*

*15. The CAM system of claim 13, wherein the at least one of the plurality of circuit segment inputs represents match information.*

*16. The CAM system of claim 13, wherein the selected one of the first circuit segment outputs is a highest priority one of the first circuit segment outputs that corresponds to the second logic level.*

*17. The CAM system of claim 13, wherein:*

*the one or more columns are a plurality of columns, and*

*the plurality of circuit segments are arranged in the plurality of columns and a plurality of rows.*

*18. The CAM system of claim 13, wherein:*

*the one or more columns are a group of columns;*

*each column in the group configured to generate a column output based on the first circuit segment output of the at least one of the circuit segments; and*

*the group configured to generate second address information based on a selected one of the column outputs that corresponds to a fifth logic level.*

*19. The CAM system of claim 13, wherein:*

*the at least one of the one or more columns is configured to pre-charge the node in response to the first input signal; and*

*the at least one of the one or more columns is configured to subsequently discharge the node in response to the one or more of the plurality of second input signals.*

*20. The CAM system of claim 13, wherein the first input signal is configurable independently of the one or more of the plurality of second input signals.*

*21. The CAM system of claim 13, wherein the first logic level and the second logic level are the same logic level.*

*22. The CAM system of claim 13, wherein the one or more columns comprise:*

*a first logic circuit configured to generate a first logic circuit output based on the selected one of the first circuit segment outputs that corresponds to the second logic level;*

*a second logic circuit configured to generate a second logic circuit output based on whether the first circuit segment output corresponds to the second logic level; and*

*a third logic circuit configured to generate the first address information based on the selected one of the first circuit segment outputs that corresponds to the second logic level.*

*23. The CAM system of claim 22, wherein at least one of the first logic circuit, the second logic circuit, and the third logic circuit is configured to set the node to the third logic level in response to the first input signal, and to subsequently change the node to the fourth logic level in response to the one or more of the plurality of second input signals.*

*24. The CAM system of claim 22, wherein:*

*the at least one of the circuit segments is configured to generate a second circuit segment output representing second address information; and*

*the one or more columns further comprise:*

*a fourth logic circuit configured to select one of the second circuit segment outputs as a less significant portion of the first address information; and*

*a fifth logic circuit configured to generate a more significant portion of the first address information.*

*25. The CAM system of claim 24, wherein at least one of the fourth logic circuit and the fifth logic circuit is configured to set the node to the third logic level in response to the first input signal, and to subsequently change the node to the fourth logic level in response to the one or more of the plurality of second input signals.*

*26. The content addressable memory (CAM) system of claim 24, wherein the one or more columns are each configured to generate a control input for the third logic circuit before or at the same time when the second circuit segment output is generated.*

*27. The content addressable memory (CAM) system of claim 22, wherein:*

*the plurality of circuit segment inputs is divided into a plurality of subsets of the circuit segment inputs; and*

*the first logic circuit comprises:*

*a plurality of fourth logic circuits each configured to generate a fourth logic circuit output based on whether at least one of a corresponding subset of the circuit segment inputs corresponds to the first logic level; and*

*a fifth logic circuit configured to generate the first circuit segment output based on whether at least one of the fourth logic circuit outputs corresponds to the first logic level.*

*28. The CAM system of claim 27, wherein:*

*at least one of the fourth logic circuit and the fifth logic circuit is configured to set the node to the third logic level in response to the first input signal, and to subsequently change the node to the fourth logic level in response to the one or more of the plurality of second input signals; and*

*the fourth logic circuit output is an input to the fifth logic circuit.*

*29. A content addressable memory (CAM) system, comprising:*

*a circuit segment configured to generate a circuit segment output based on whether at least one of a plurality of circuit segment inputs received by the circuit segment corresponds to a first logic level,*

*the circuit segment configured to set a node to a second logic level in response to an input signal, and to subsequently change the node to a third logic level in response to the plurality of circuit segment inputs,*

*the circuit segment output corresponding to said third logic level.*

*30. The CAM system of claim 29, wherein at least one of the plurality of circuit segment inputs corresponds to a match line output.*

*31. The CAM system of claim 29, wherein the circuit segment output represents circuit segment hit information.*

*32. The CAM system of claim 29, wherein at least one of the plurality of circuit segment inputs represents match information.*

*33. The CAM system of claim 29, wherein:*

*the circuit segment is configured to pre-charge the node in response to the input signal; and*

*the circuit segment is configured to subsequently discharge the node in response to the plurality of circuit segment inputs.*

*34. The CAM system of claim 29, wherein the input signal is configurable independently of the plurality of circuit segment inputs.*

*35. The CAM system of claim 29, wherein the first logic level and the third logic level are the same logic level.*

*36. The CAM system of claim 29, wherein the circuit segment is a first circuit segment, and further comprising a second circuit segment configured to generate address information based on the circuit segment output.*

* * * * *